United States Patent [19]

Robinson

[11] Patent Number: 5,043,583
[45] Date of Patent: Aug. 27, 1991

[54] ELECTRON DETECTOR

[76] Inventor: Vivian N. E. Robinson, 13 Permanent Ave., Earlwood, New South Wales 2206, Australia

[21] Appl. No.: 499,728

[22] Filed: Mar. 27, 1990

[30] Foreign Application Priority Data

Mar. 28, 1989 [GB] United Kingdom ............... 8906968

[51] Int. Cl.$^5$ ........................................... H01J 37/244
[52] U.S. Cl. ................................. 250/397; 250/361 R; 250/363.01
[58] Field of Search ............... 250/397, 361 R, 363 R, 250/363.01

[56] References Cited

U.S. PATENT DOCUMENTS

| | | | |
|---|---|---|---|
| 3,896,308 | 7/1975 | Venables et al. | 250/397 |
| 4,217,495 | 8/1980 | Robinson | 250/310 |
| 4,551,625 | 11/1985 | Lischke et al. | 250/310 |
| 4,559,450 | 12/1985 | Robinson et al. | 250/310 |
| 4,596,929 | 6/1986 | Coates et al. | 250/397 |
| 4,803,357 | 2/1989 | Brust | 250/397 |

FOREIGN PATENT DOCUMENTS

| | | |
|---|---|---|
| 775656 | 4/1953 | United Kingdom . |
| 1140337 | 9/1967 | United Kingdom . |
| .1304344 | 2/1969 | United Kingdom . |
| 2050689A | 5/1980 | United Kingdom . |

Primary Examiner—Jack I. Berman
Attorney, Agent, or Firm—Knobbe, Martens, Olson & Bear

[57] ABSTRACT

The present invention relates to an electron detector for use in a scanning electron microscope. The detector is used to detect high and low energy backscattered electrons as well as secondary electrons. The detector is based on the use of a high transparency conductive film over the surface of the detector, whereby the surface is stable to the application of a high voltage. The detector is be used to detect both high and low energy backscattered secondary electrons and has an active surface with an adjacent fine metal mesh grid which is used to transmit electrons without loss of energy, while at the same time providing a conductive surface over the surface of the detector material.

10 Claims, 4 Drawing Sheets

ELECTRON DETECTOR

The present invention relates to an electron detector for use in a scanning electron microscope, which detector can detect high and low energy backscattered electrons as well as secondary electrons. It is based upon the use of a high transparency conductive film over the surface of the detector, which film is stable to the application of a positive high voltage.

Most backscattered electron detectors rely upon the energy of the electron to excite a signal in the detector. The higher the energy of the electron, the greater the signal output per electron. Conversely, low energy electrons give a smaller signal. Ultimately, an electron can have so low an energy, as to be unable to penetrate the conducting film and dead layer on the surface, and not excite any signal at all. This usually limits the lower energy level at which a backscattered electron detector can operate.

There are two methods of improving the lower limit of energy level detectable by a backscattered electron detector. One method is to remove the surface film, thus eliminating the energy loss as a low energy electron passes through it. The second technique is to apply a positive voltage to the active surface of the detector, thus increasing the energy of an electron, increasing the signal output from the detector.

The secondary electron detector relies upon this principle. A positive voltage both attracts low energy secondary electrons across to it and increases their energy from 1-2 eV, to typically +10kV, resulting in a strong signal given off from very low energy electrons.

To operate efficiently, a backscattered electron detector must be placed close to the specimen and subtend a large solid angle with respect to the specimen. Typically, a backscattered electron detector has a surface area from between 200 sq. mm. to over 2,000 sq. mm. and/or subtends an angle of greater than 0.8 steradian with respect to the specimen. In order to obtain a good signal from a low energy backscattered electron, a positive voltage must be applied to the detector, thus increasing the energy of the electron and causing it to give out a greater signal. However, once a voltage of sufficient strength, usually a minimum of several hundred volts, is applied to the large surface area of the conductive film on the surface of the detector, it becomes unstable, resulting in breakdown of the detector. The present invention relates to the use of a film on the surface of the detector which remains stable when a voltage is applied to it.

Prior art electron microscope backscattered electron detectors are described in U.S. Pat. No. 4,217,495 to Robinson VNE and a quantitative compositional analyser for use with scanning electron microscopes is described in U.S. Pat. No. 4,559,450 to Robinson et al.

U.S. Pat. No. 4,217,495 relates to a detector having an arm of scintillation material with a hole through which an electron beam passes, the hole being provided with a removable grounded liner to facilitate cleaning and to prevent astigmatism problems due to electron build up.

U.S. Pat. No. 4,559,450 relates to an analyser system for a scanning electron microscope having a backscattered electron detector. The output of the detector is amplified, processed by an analogue to digital converter, multi-channel analyser, and digital conversion and processing circuit to generate a signal indicative of atomic number factor of the specimen.

The present invention is based upon the ability of a metal mesh grid to transmit electrons without loss of energy, whilst at the same time. providing a conductive surface over the surface of the detector material, which surface is stable to the application of a high voltage. The mesh has a three fold effect. Firstly it provides a conductive screen around the insulating detection material, which screen prevents the buildup of negative charge from distorting the beam and producing astigmatism in the final image. Secondly, it provides an earth potential which results in some conduction of the electrons from the detector material to the mesh, reducing charge buildup. Thirdly, it is stable to the application of a high voltage.

According to one aspect of the present invention there is disclosed an electron detector having a fine metal mesh grid adjacent its active surface. Preferably the fine metal mesh grid rests against the surface of the detector, being held in place by a sleeve or clamp, or is held away from the surface of the detector by any distance up to 2.0 mm by any suitable sleeve or clamp.

In another aspect of the invention, the metal mesh is bonded to the surface of the detector, using a scintillator glueing process, or a heat fusion process. The mesh is preferably connected to an earth potential.

In another embodiment of the detector, the metal mesh grid is preferably connected to a fixed, or variable positive voltage, in such a way as to attract electrons across to the mesh and thus enable them to travel through to the detector material and so be detected. This voltage is in the range of values from +0.1kV to +10.0kV.

In a further embodiment, the detector is enclosed within a larger meshed or grid structure to which a voltage can be applied to attract or repel low energy electrons.

Embodiments of the present invention will now be described with reference to the drawings, in which.

Figure 1:
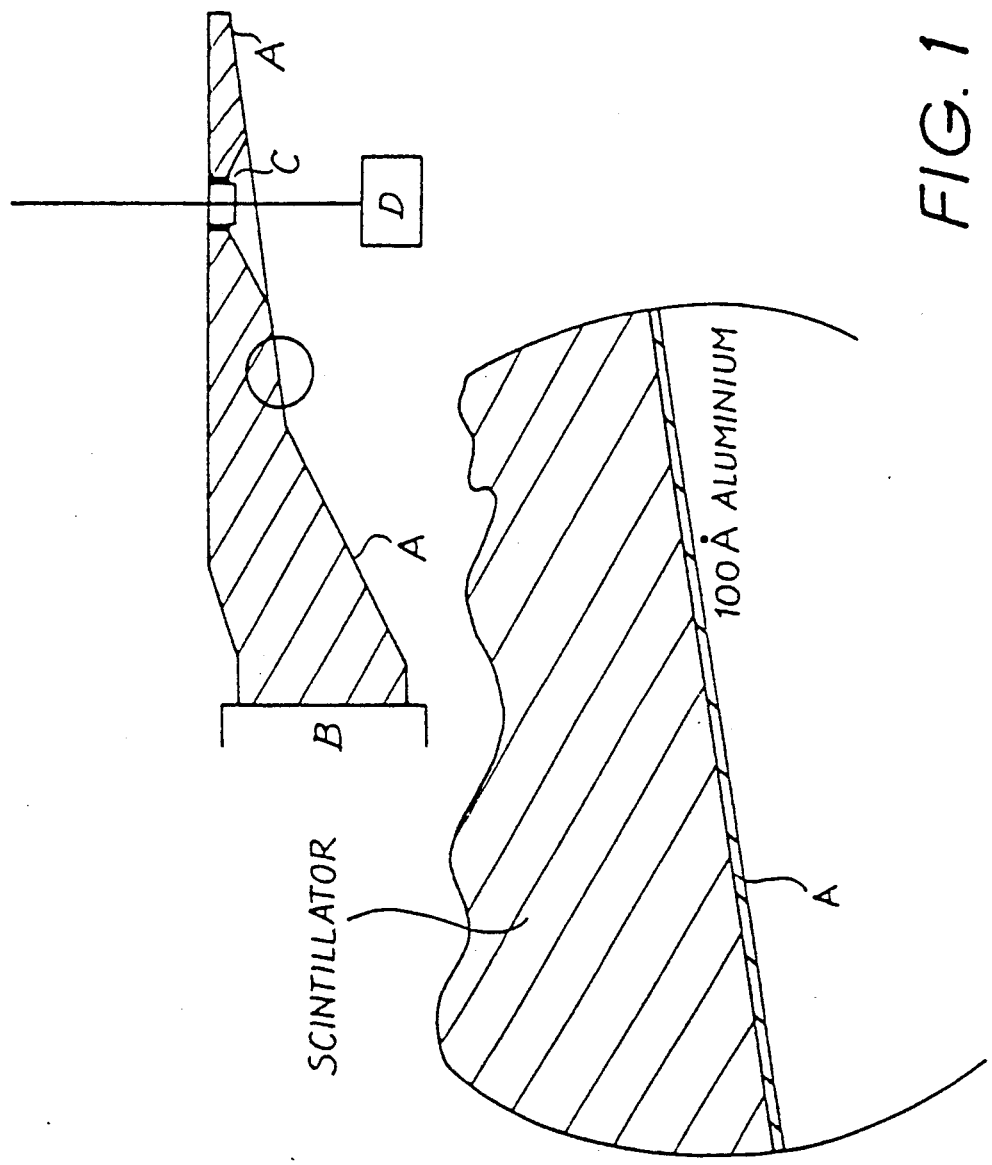
FIG. 1 is a drawing of a typical scintillation detector.

Turning now to FIG. 1, a typical scintillator electron detector consists of a specially shaped scintillator which can detect electrons on it's active surface, marked "A". The electrons excite photons in the scintillation material, which are then transmitted to a photomultiplier tube, or equivalent radiation detection device, positioned at point "B". The electrons from the electron optics column of the electron microscope pass through the aperture, marked "C" on the drawing, to impinge upon the specimen, marked "D". Some of the electrons are backscattered out of the specimen and move on to be detected by the scintillator. As they pass through a metal film located on the surface of the scintillator, they lose some of their energy before they impinge upon the scintillator surface to become detected. When the electrons only have an energy of about 1 keV, the stopping power of the metal film is such as to prevent most of them from reaching the scintillator and being detected. Consequently, these detectors have very poor, or no detection efficiency for these low energy backscattered electrons.

Figure 2:
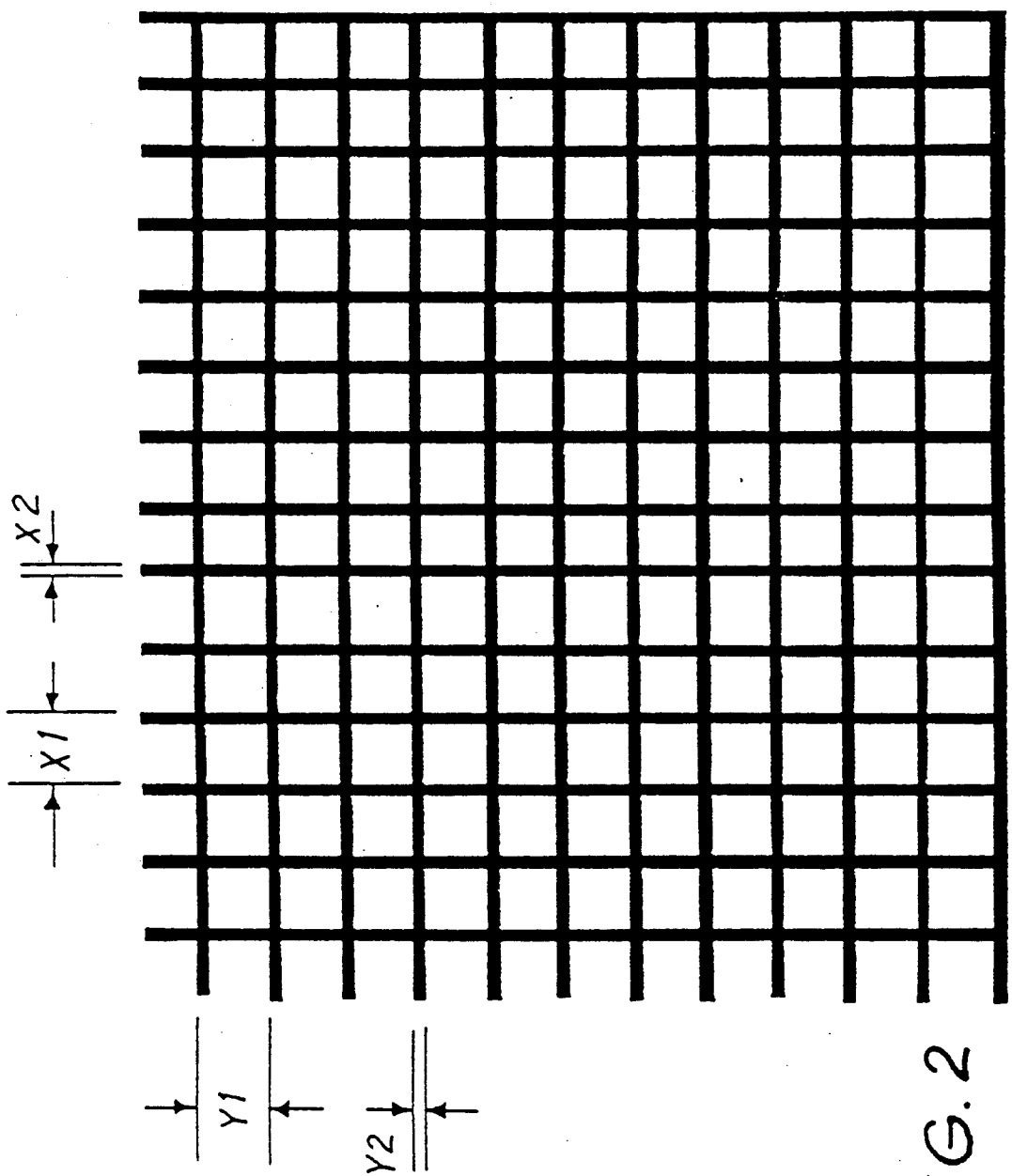
FIG. 2 is a drawing of a typical metal mesh grid of the preferred embodiment.

Turning now to FIG. 2, it shows typical dimensions of suitable metal mesh grid. The dimensions of this grid are between:

X1 = 5mm, X1 = 0.01mm, X2 = 0.002mm, X2 = 2mm

Y1 = 5mm, Y1 = 0.01mm, Y2 = 0.002mm, Y2 = 2mm
X1 and X2 do not necessarily have to equal Y1 and Y2 respectively.

The mesh is formed by any manner, including, but not restricted to woven, electrode position, i.e., bars in one direction only, bi-directional as indicated, or multi-directional. It can be composed of any conducting material, but typically nickel, gold, copper, or aluminium would be used.

In practice, the mesh would have dimensions of approximately:

X1 = Y1 = 0.33mm, X2 = Y2 = 0.024mm, being electroformed Nickel mesh, MN-17, manufactured by:
Buckbee Mears,
245 East 6th Street,
St Paul, MN 55101,
U.S.A.

The major advantages of this mesh are that it has a high electron transmission, nominally 90%, is cheaper than other materials and has the finest commercially available structure. The coarser is the material, the more the charging surface attracts the lines of force from the secondary electron detector, reducing the effectiveness of that detector. Beyond the 5 mm spacings, the mesh is too widely separated to effectively screen out the charge buildup on the detector surface, introducing the possibility of astigmatism.

This mesh is placed as close as possible to the surface of the detector. Ideally, it should be held against the surface of the detector and in any event, should be less than 2 mm from the surface of the detector material. It is held in place by any means possible, including but not restricted to glueing, spot welding, soldering, or mechanical fixation to the detector support sleeve.

In another variation, the mesh is bonded onto the surface of the scintillator. In the case of plastic scintillation material, typically NE 102A (manufactured by Nuclear Enterprises, Sighthill, Scotland) the mesh can be bonded by resting it on the surface of the detector and painting a solution of plastic scintillator in toluene, or liquid toluene over the mesh and scintillator. The liquid forms a partial solution on the surface of the scintillator, into which the mesh can settle. After the toluene evaporates, the mesh is firmly bonded onto the surface of the scintillator.

Alternatively, the mesh is rested against the surface of the scintillator and is heated using a hot surface. This hot mesh melts the plastic, causing the mesh to mould into the scintillation material, and similarly be bonded to the material.

The above techniques are suggested methods for bonding the mesh to the scintillator. The bonding can be achieved by any other process which does not involve the application of any non scintillating material to the surface of the scintillator. This deposits a layer through which the electrons would have to penetrate and consequently defeat the purpose of using a mesh.

There are two situations involving the mesh bonded to the scintillator. In one variation, the mesh is connected to earth potential. In another variation, the mesh is isolated from earth potential and connected to a potential which can be either fixed, or varied between the values of +100 volts to +10,000 volts.

When a positive voltage is applied to the metal mesh grid, it attracts low energy electrons towards it. The shape of the electrostatic field formed by the application of the voltages determines that many electrons will pass through the grid and impinge upon the active region of the detector. The increased energy of the electrons enables them to give a larger signal than would otherwise be achieved, giving more efficient detection.

The application of such a voltage to a detecting surface, both distorts the shape of the incident electron beam, thus producing astigmatism, or attracts secondary electrons, which interfere with the low energy backscattered electrons which are desired to be detected. Applying a second grid, which can be either earthed, or have a variable positive or negative voltage applied to it, will overcome these problems.

This second grid is be separated from the surface of the first grid by at least 1 millimeter, and not more than 5 millimeters. It has dimensions within the range given in FIG. 2 above, but does not have to have the same dimensions as the mesh attached to the scintillator.

Figure 3:
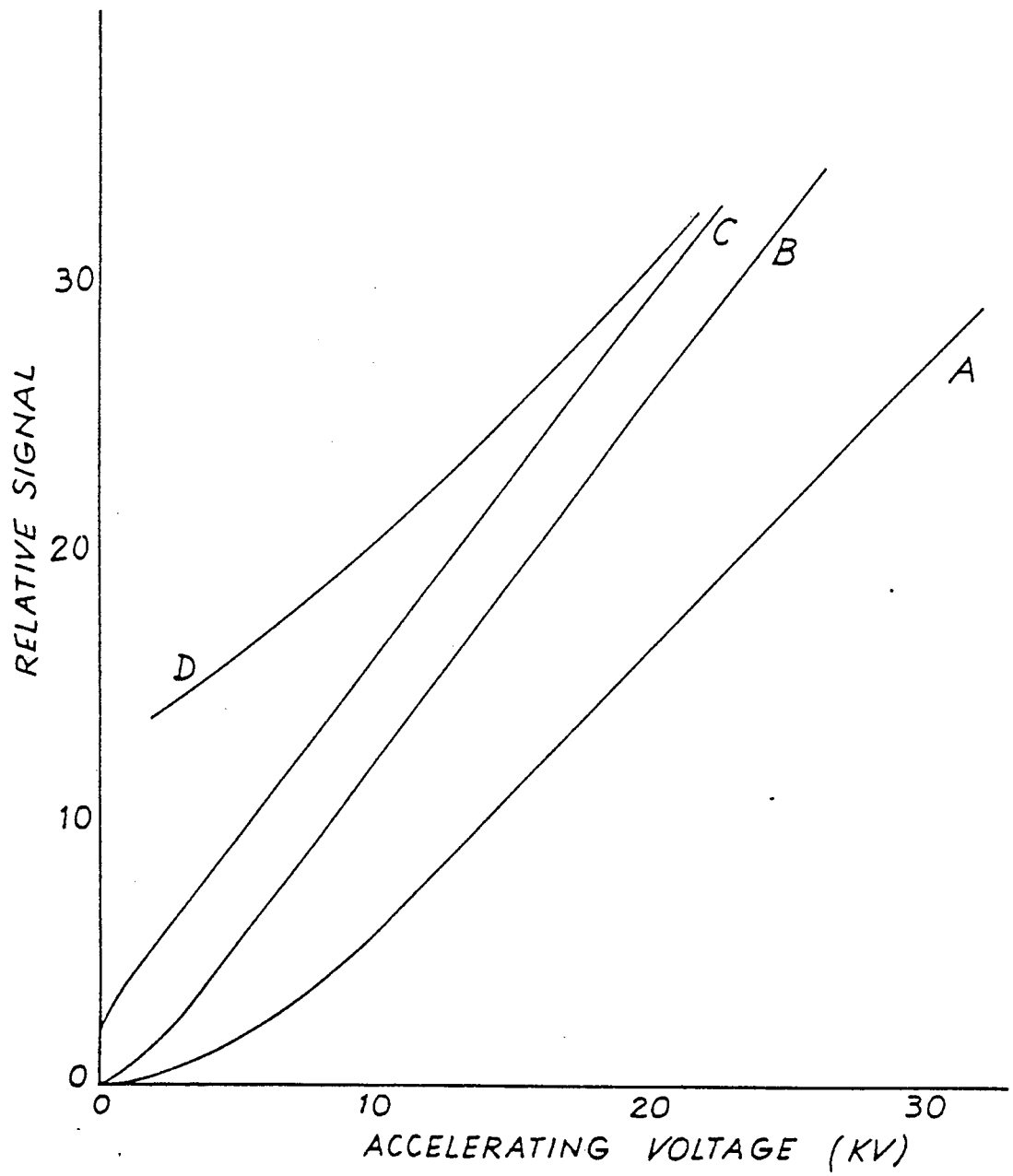
FIG. 3 is a graph illustrating the improvements which can be obtained from using a detector of the present invention.

FIG. 3 illustrates the improvements in signal which can be obtained from this type of detector, over the standard aluminium film coated scintillator. Curve A shows the signal from the standard detector, active surface coated with 100 angstrom of aluminium. Curve B shows the improvement which results from the use of the mesh, in place the aluminium layer. Curves C and D illustrate the signal from the application of a positive voltage of 3,000 volts. Curve D contains the effect of the secondary electrons added into the backscattered electron signal, produced by not applying a negative voltage to the grid surround the scintillator material. Curve C shows the effect of applying a negative voltage to exclude the secondary electrons. The four curves, A, B, C and D were obtained using the same beam current and amplification settings, and varying only the beam accelerating voltage.

Figure 4:
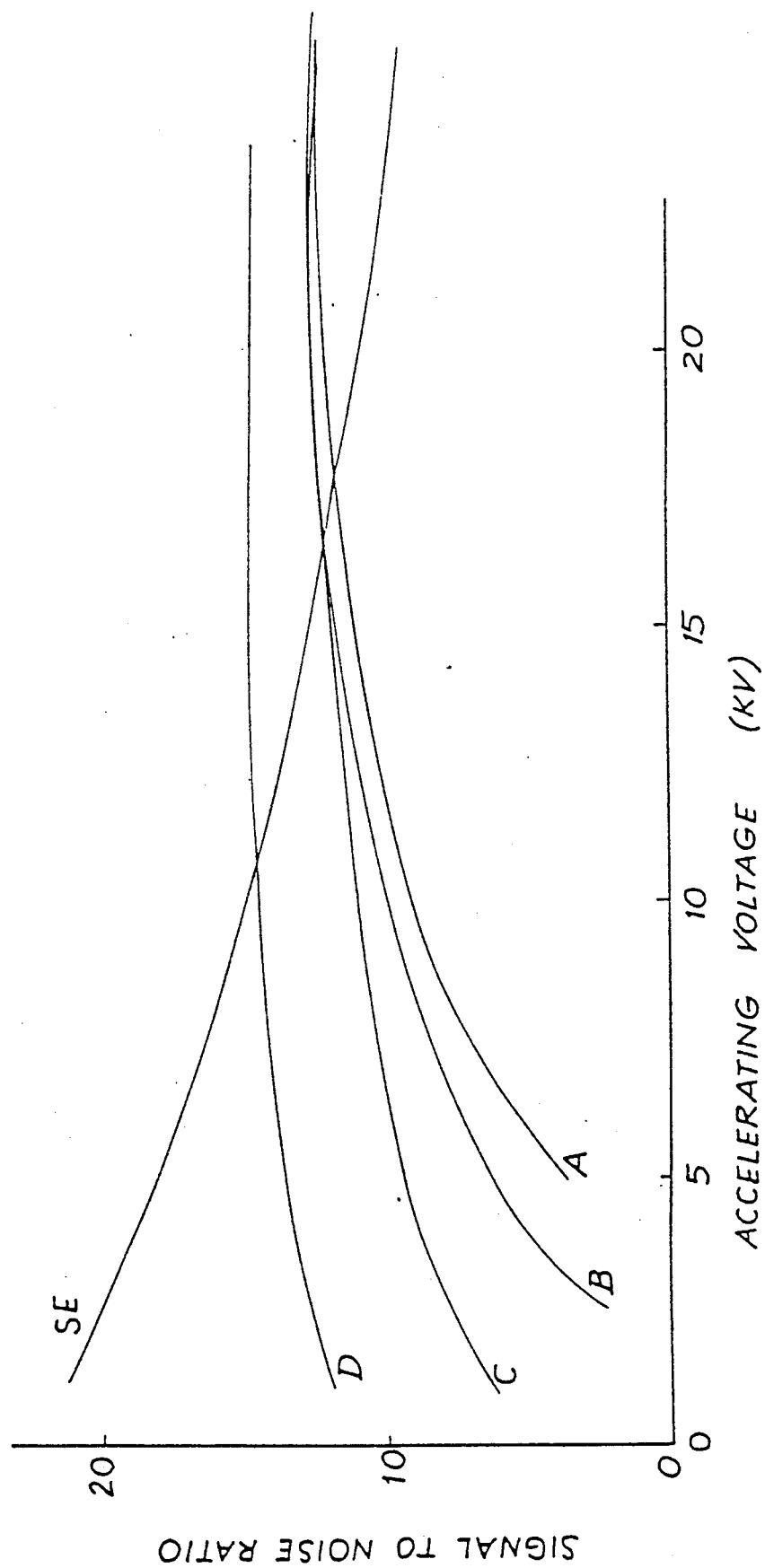
FIG. 4 is a graph illustrating the improvements in the signal to noise ratio of the detector of the present invention.

FIG. 4 shows this translated into signal to noise. The clear improvement in the signal to noise of this type of detector, over existing backscattered electron detectors, at low beam accelerating voltages, is easily seen. The curve marked SE shows the signal to noise obtained from the secondary electron detector, under the same conditions.

Naturally, the specific use of scintillation material as an illustration of the construction of such a detector does not imply that the foregoing is restricted to the use of scintillation material. Other detection surfaces such as silicon diode and other solid state radiation detection material are also covered by the present invention.

The foregoing describes only some embodiments of the present invention and modifications obvious to those skilled in the art can be made thereto without departing from the scope of the present invention.

What I claim is:
1. A backscattered electron detector, comprising:
a scintillator with an active surface being covered by a fine metal mesh grid abutting the active surface;
said fine metal mesh grid having a positive voltage applied thereto so as to attract all electrons including secondary electrons having a lower energy and backscattered electrons having a higher energy towards said grid and said scintillator, wherein the lower energy secondary electrons are attracted to said fine metal mesh grid and the higher energy backscattered electrons impinge upon said active surface of said scintillator.

2. A backscattered electron detector as defined in claim 1, wherein said fine metal mesh grid is bonded onto said active surface by a heat fusion process.

3. A backscattered electron detector as defined in claim 1, wherein said fine metal mesh grid is bonded onto said active surface by means of a scintillator glueing process.

4. A backscattered electron detector as defined in claim 1, wherein said fine metal mesh grid has dimensions of spacings in the range of 0.01 mm to 5.0 mm and having thickness in the range of 0.002 mm to 2.0 mm.

5. A backscattered electron detector as defined in claim 1, wherein said positive voltage is in the range of +0.1kV to +10kV.

6. A method of detecting backscattered electrons with an electron microscope comprising a scintillator having an active surface covered by a conductive grid, said method comprising the steps of:

irradiating a specimen with an electron beam;
applying a positive voltage to the grid; and
detecting backscattered electrons which impinge on the active surface of the scintillator.

7. An electron detector, comprising:
a scintillator having an active surface;
a conductive mesh;
means for securing the mesh to the active surface of the scintillator; and
means for applying a positive voltage to the mesh so as to attract secondary electrons and permit backscattered electrons to impinge on the active surface of the scintillator.

8. An electron detector as defined in claim 7, wherein said securing means comprises bonding.

9. An electron detector as defined in claim 7, wherein said securing means comprises a heat fusion process.

10. An electron detector as defined in claim 6, wherein said securing means comprises a scintillator glueing process.

* * * * *